(12) United States Patent
Matsushita (10) Patent No.: US 10,957,773 B1
(45) Date of Patent: Mar. 23, 2021

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Kenichi Matsushita, Nonoichi (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/784,356

(22) Filed: Feb. 7, 2020

(30) Foreign Application Priority Data

Sep. 5, 2019 (JP) .............................. JP2019-162271

(51) Int. Cl.
*H01L 29/423* (2006.01)
*H01L 29/06* (2006.01)
(Continued)

(52) U.S. Cl.
CPC .... *H01L 29/42376* (2013.01); *H01L 29/0692* (2013.01); *H01L 29/435* (2013.01);
(Continued)

(58) Field of Classification Search
CPC ..... H01L 29/49; H01L 29/435; H01L 29/783; H01L 29/7395; H01L 29/7393;
(Continued)

(56) References Cited

U.S. PATENT DOCUMENTS 7,119,379 B2   10/2006  Ninomiya et al.
7,642,599 B2 *  1/2010  Ninomiya ........... H01L 29/0692
                                                  257/355
(Continued)

FOREIGN PATENT DOCUMENTS

JP         4469584 B2      5/2010
JP      2011-49393 A       3/2011
(Continued)

*Primary Examiner* — Chuong A Luu
(74) *Attorney, Agent, or Firm* — Oblon, McClelland, Maier & Neustadt, L.L.P.

(57) ABSTRACT

According to one embodiment, a semiconductor device includes a first electrode, a first semiconductor region, a second semiconductor region, a third semiconductor region, a first ring-shaped region, a second ring-shaped region, a second electrode, a third electrode, a first conductive layer, and a semi-insulating layer. The first ring-shaped region surrounds the second semiconductor region, and is provided between the second and third semiconductor regions. The second ring-shaped region surrounds the first ring-shaped region, and is provided between the first ring-shaped region and the third semiconductor region. The first conductive layer surrounds the second electrode, and is provided on the first ring-shaped region, the second ring-shaped region, and a first region of the first semiconductor region with an insulating layer interposed. The first region is positioned between the first and second ring-shaped regions. The semi-insulating layer contacts the second electrode, the first conductive layer, and the third electrode.

11 Claims, 10 Drawing Sheets

(51) Int. Cl.
*H01L 29/43* (2006.01)
*H01L 29/739* (2006.01)
*H01L 29/78* (2006.01)
*H01L 29/66* (2006.01)
*H01L 29/73* (2006.01)
*H01L 29/49* (2006.01)
*H01L 29/76* (2006.01)
*H01L 29/737* (2006.01)

(52) U.S. Cl.
CPC .......... *H01L 29/49* (2013.01); *H01L 29/6659* (2013.01); *H01L 29/66242* (2013.01); *H01L 29/66265* (2013.01); *H01L 29/66272* (2013.01); *H01L 29/66325* (2013.01); *H01L 29/7302* (2013.01); *H01L 29/7371* (2013.01); *H01L 29/7393* (2013.01); *H01L 29/7395* (2013.01); *H01L 29/7397* (2013.01); *H01L 29/76* (2013.01); *H01L 29/783* (2013.01); *H01L 29/7816* (2013.01); *H01L 29/7833* (2013.01)

(58) Field of Classification Search
CPC ............. H01L 29/7833; H01L 29/7302; H01L 29/7397; H01L 29/6659; H01L 27/1104; H01L 2924/13055; H01L 2924/13091; H01L 2924/13026; H01L 29/06; H01L 29/12; H01L 29/41; H01L 29/47; H01L 29/76; H01L 29/861; H01L 29/66325; H01L 29/78; H01L 29/868; H01L 29/872; H01L 29/739; H01L 29/792; H01L 29/812; H01L 29/778; H01L 29/7816; H01L 29/7371; H01L 29/66272; H01L 23/52; H01L 21/28; H01L 21/3205
USPC ........................................................ 257/401
See application file for complete search history.

(56) References Cited

U.S. PATENT DOCUMENTS

| | | | |
|---|---|---|---|
| 8,008,734 B2 | 8/2011 | Wakimoto et al. | |
| 8,232,593 B2* | 7/2012 | Saito | H01L 29/0692 257/329 |
| 8,294,244 B2 | 10/2012 | Suzuki et al. | |
| 8,809,969 B2 | 8/2014 | Tarui et al. | |
| 8,860,189 B2* | 10/2014 | Nishimura | H01L 29/868 257/656 |
| 9,000,538 B2* | 4/2015 | Murakawa | H01L 29/66727 257/409 |
| 2017/0263724 A1 | 9/2017 | Kodera et al. | |

FOREIGN PATENT DOCUMENTS

| | | |
|---|---|---|
| JP | 5205856 B2 | 6/2013 |
| JP | 5224289 B2 | 7/2013 |
| JP | 2018-201050 A | 12/2018 |

* cited by examiner

SEMICONDUCTOR DEVICE

CROSS-REFERENCE TO RELATED APPLICATIONS

This application is based upon and claims the benefit of priority from Japanese Patent Application No. 2019-162271, filed on Sep. 5, 2019; the entire contents of which are incorporated herein by reference.

FIELD

Embodiments described herein relate generally to a semiconductor device.

BACKGROUND

A semiconductor device such as a diode, a Metal Oxide Semiconductor Field Effect Transistor (MOSFET), an Insulated Gate Bipolar Transistor (IGBT), or the like is used in applications such as power conversion, etc. High reliability of the semiconductor device is desirable.

DETAILED DESCRIPTION

According to one embodiment, a semiconductor device includes a first electrode, a first semiconductor region of a first conductivity type, a second semiconductor region of a second conductivity type, a third semiconductor region of the first conductivity type, a first ring-shaped region of the second conductivity type, a second ring-shaped region of the second conductivity type, a second electrode, a third electrode, a first conductive layer, and a semi-insulating layer. The first semiconductor region is provided on the first electrode and electrically connected to the first electrode. The second semiconductor region is provided on the first semiconductor region. The third semiconductor region surrounds the second semiconductor region. The third semiconductor region is provided on the first semiconductor region. An impurity concentration of the first conductivity type in the third semiconductor region is higher than an impurity concentration of the first conductivity type in the first semiconductor region. The first ring-shaped region surrounds the second semiconductor region. The first ring-shaped region is provided between the second semiconductor region and the third semiconductor region. The first ring-shaped region is separated from the second semiconductor region and the third semiconductor region. The second ring-shaped region surrounds the first ring-shaped region. The second ring-shaped region is provided between the first ring-shaped region and the third semiconductor region. The second ring-shaped region is separated from the first ring-shaped region and the third semiconductor region. The second electrode is provided on the second semiconductor region and electrically connected to the second semiconductor region. The third electrode surrounds the second electrode, is provided on the third semiconductor region, and is electrically connected to the third semiconductor region. The first conductive layer surrounds the second electrode. The first conductive layer is separated from the second electrode and the third electrode. The first conductive layer is provided on the first ring-shaped region, the second ring-shaped region, and a first region of the first semiconductor region with an insulating layer interposed. The first region is positioned between the first ring-shaped region and the second ring-shaped region. The semi-insulating layer contacts the second electrode, the first conductive layer, and the third electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the drawings and the description recited below, the notations of $n^+$, n, $n^-$, $p^+$, p, and $p^-$ indicate relative levels of the impurity concentrations. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate relative levels of the net impurity concentrations after the impurities are compensated.

In the embodiments described below, each embodiment may be performed by inverting the p-type and the n-type of each semiconductor region.

First Embodiment

Figure 1:
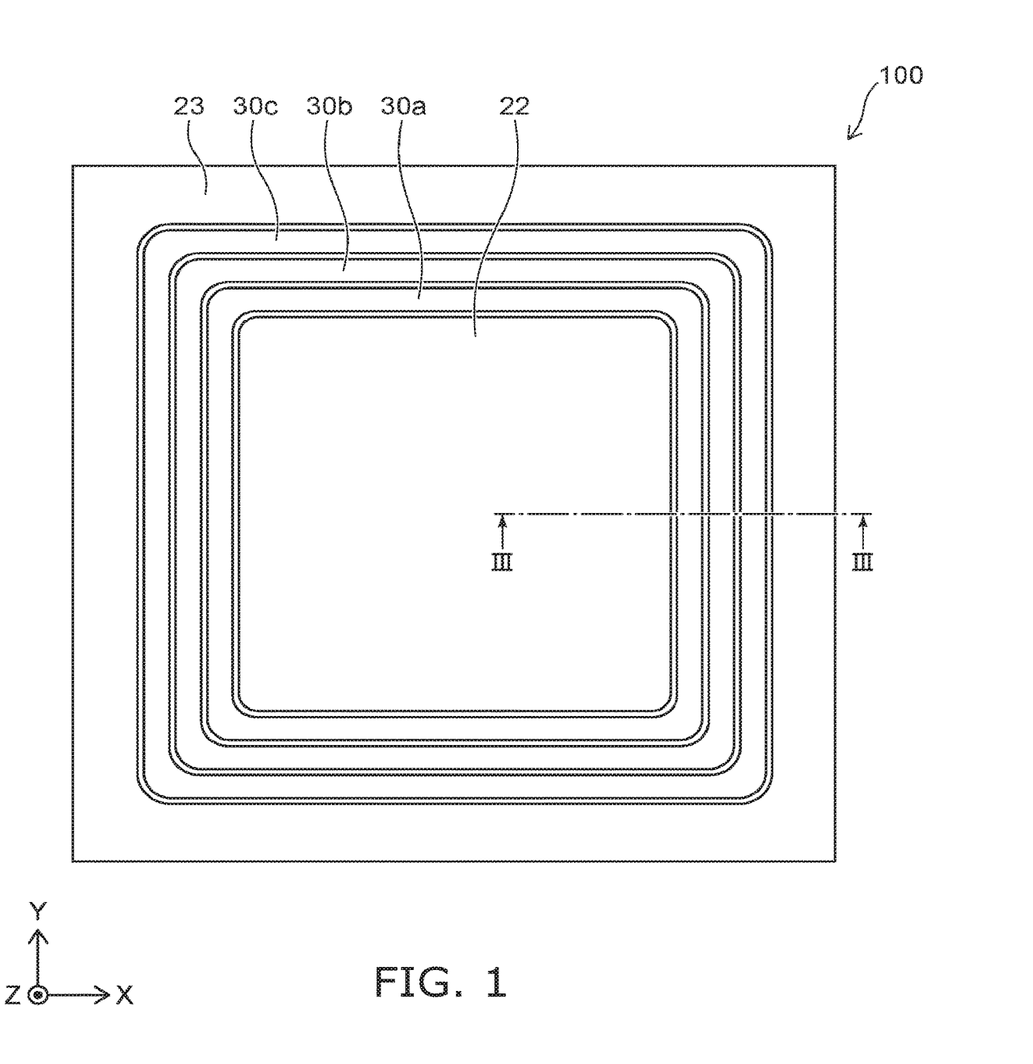
FIG. 1 is a plan view illustrating a semiconductor device according to a first embodiment.
Figure 2:
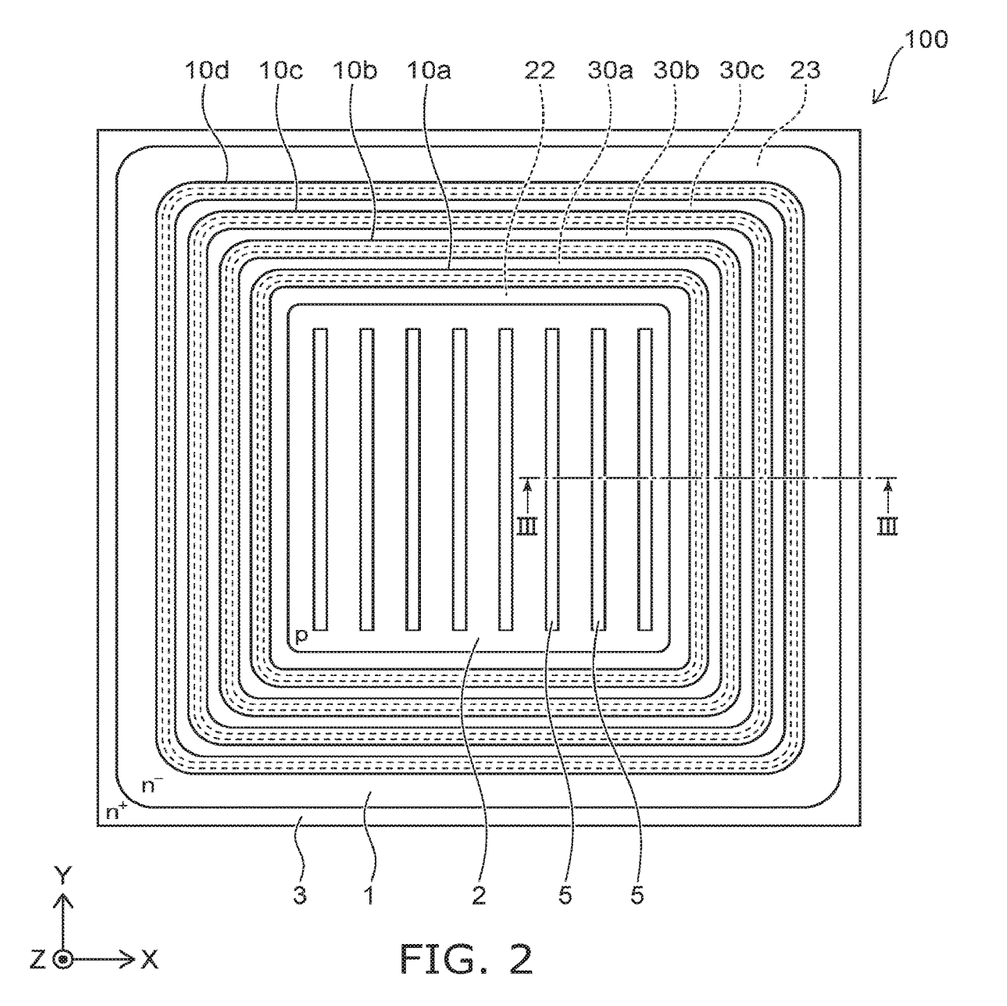
FIG. 2 is a plan view illustrating the semiconductor device according to the first embodiment.

FIG. 1 and FIG. 2 are plan views illustrating a semiconductor device according to a first embodiment.

Figure 3:
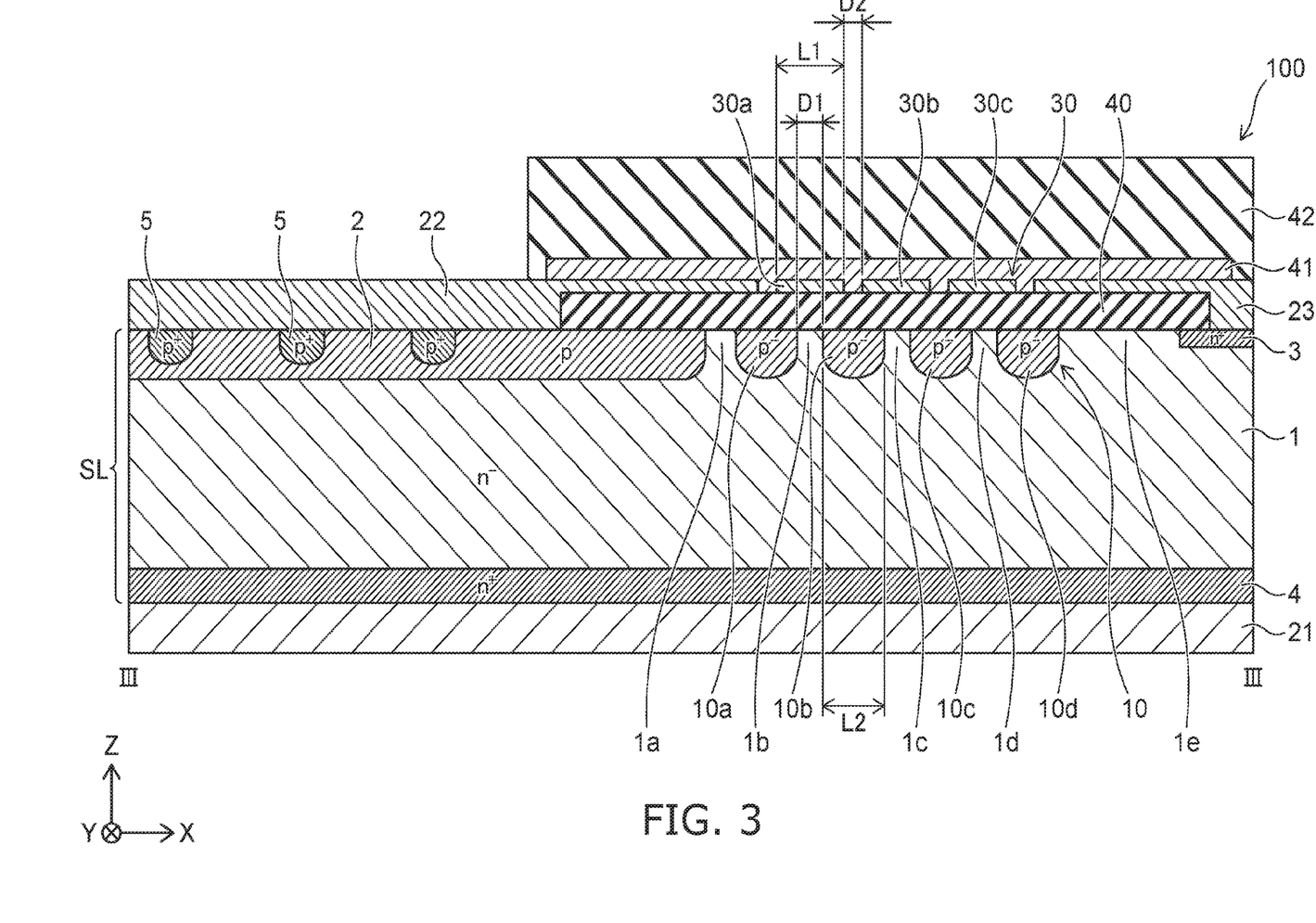
FIG. 3 is a III-III cross-sectional view of FIG. 1 and FIG. 2.

FIG. 3 is a III-III cross-sectional view of FIG. 1 and FIG. 2. A semi-insulating layer 41 and an insulating portion 42 are not illustrated in FIG. 1. In FIG. 2, an insulating layer 40, the semi-insulating layer 41, and the insulating portion 42 are not illustrated; and an upper electrode 22, an EQuivalent- Potential Ring (EQPR) electrode 23, and multiple conductive layers 30 are illustrated by broken lines.

The semiconductor device 100 according to the first embodiment is a diode. As illustrated in FIG. 1 to FIG. 3, the semiconductor device 100 includes a semiconductor layer SL, a lower electrode 21 (a first electrode), the upper electrode 22 (a second electrode), the EQPR electrode 23 (a third electrode), the conductive layers 30, the insulating layer 40, the semi-insulating layer 41, and the insulating portion 42.

The semiconductor layer SL includes an n$^-$-type (first conductivity type) semiconductor region 1 (a first semiconductor region), a p-type (second conductivity type) semiconductor region 2 (a second semiconductor region), an n$^+$-type EQPR region 3 (a third semiconductor region), an n$^+$-type contact region 4, a p$^+$-type contact region 5, and a p$^-$-type ring-shaped region 10.

An XYZ orthogonal coordinate system is used in the description of the embodiments. The direction from the lower electrode 21 toward the n$^-$-type semiconductor region 1 is taken as a Z-direction. Two mutually-orthogonal directions perpendicular to the Z-direction are taken as an X-direction and a Y-direction. A direction from the center of the semiconductor device 100 toward the outer perimeter is taken as a diametrical direction. For the description, the direction from the lower electrode 21 toward the n$^-$-type semiconductor region 1 is called "up;" and the reverse direction is called "down." These directions are based on the relative positional relationship between the lower electrode 21 and the n$^-$-type semiconductor region 1 and are independent of the direction of gravity.

As illustrated in FIG. 3, the lower electrode 21 is provided at the lower surface of the semiconductor device 100. The n$^+$-type contact region 4 is provided on the lower electrode 21 and electrically connected to the lower electrode 21. The n$^-$-type semiconductor region 1 is provided on the n$^+$-type contact region 4. The n$^-$-type semiconductor region 1 is electrically connected to the lower electrode 21 via the n$^+$-type contact region 4.

The p-type semiconductor region 2, the n$^+$-type EQPR region 3, and the p$^-$-type ring-shaped region 10 are provided on the n$^-$-type semiconductor region 1. For example, as illustrated in FIG. 2, the p-type semiconductor region 2 is provided at the central portion of the semiconductor device 100 in the X-direction and the Y-direction. The n$^+$-type EQPR region 3 surrounds the p-type semiconductor region 2. For example, the n$^+$-type EQPR region 3 is provided along the end portions in the X-direction and the end portions in the Y-direction of the semiconductor device 100. Multiple p$^-$-type ring-shaped regions 10 are provided between the p-type semiconductor region 2 and the n$^+$-type EQPR region 3. The p$^-$-type ring-shaped regions 10 each surround the p-type semiconductor region 2. The p-type semiconductor region 2, the n$^+$-type EQPR region 3, and the multiple p$^-$-type ring-shaped regions 10 are separated from each other in the diametrical direction. The number of the p$^-$-type ring-shaped regions 10 is designed appropriately according to the desired breakdown voltage of the semiconductor device 100.

The n-type impurity concentration in the n$^+$-type EQPR region 3 is higher than the n-type impurity concentration in the n$^-$-type semiconductor region 1. The p-type impurity concentration in the p$^-$-type ring-shaped region 10 may be the same as the p-type impurity concentration in the p-type semiconductor region 2 or may be different from the p-type impurity concentration in the p-type semiconductor region 2.

As illustrated in FIG. 2 and FIG. 3, the p$^+$-type contact region 5 is provided selectively on the p-type semiconductor region 2. The p-type impurity concentration in the p$^+$-type contact region 5 is higher than the p-type impurity concentration in the p-type semiconductor region 2. The configuration, the number, the position, etc., of the p$^+$-type contact region 5 are designed appropriately according to the desired characteristics of the semiconductor device 100.

The upper electrode 22 is provided on the p-type semiconductor region 2 and the p$^+$-type contact region 5 and electrically connected to the p-type semiconductor region 2 and the p$^+$-type contact region 5. The EQPR electrode 23 is provided on the n$^+$-type EQPR region 3 and electrically connected to the n$^+$-type EQPR region 3. Multiple conductive layers 30 are provided between the upper electrode 22 and the EQPR electrode 23.

The multiple conductive layers 30 are provided on the multiple p$^-$-type ring-shaped regions 10 with the insulating layer 40 interposed. Therefore, the multiple conductive layers 30 are not directly connected electrically to the multiple p$^-$-type ring-shaped regions 10. In the example illustrated in FIG. 3, the insulating layer 40 is provided also between the outer perimeter of the p-type semiconductor region 2 and the outer perimeter of the upper electrode 22 and between the inner perimeter of the n$^+$-type EQPR region 3 and the inner perimeter of the EQPR electrode 23.

For example, as illustrated in FIG. 1, the upper electrode 22 is provided at the central portion of the semiconductor device 100 in the X-direction and the Y-direction. The EQPR electrode 23 is separated from the upper electrode 22 in the diametrical direction and surrounds the upper electrode 22. The EQPR electrode 23 is provided along the end portions in the X-direction and the end portions in the Y-direction of the semiconductor device 100. The upper electrode 22, the EQPR electrode 23, and the multiple conductive layers 30 are separated from each other in the diametrical direction.

As illustrated in FIG. 3, the semi-insulating layer 41 contacts the EQPR electrode 23, the multiple conductive layers 30, and the outer perimeter of the upper electrode 22. Therefore, the upper electrode 22, the multiple conductive layers 30, and the EQPR electrode 23 are electrically connected via the semi-insulating layer 41. As long as the upper electrode 22, the multiple conductive layers 30, and the EQPR electrode 23 are electrically connected via the semi-insulating layer 41, the configuration of the semi-insulating layer 41 is modifiable as appropriate. For example, in the X-direction and the Y-direction, multiple semi-insulating layers 41 may be provided between the upper electrode 22 and the conductive layer 30, between the conductive layers 30, and between the EQPR electrode 23 and the conductive layer 30.

The insulating portion 42 is provided on the semi-insulating layer 41. For example, the insulating portion 42 seals the outer perimeter of the semiconductor device 100 upper surface. The central portion of the upper surface of the upper electrode 22 is not covered with the insulating portion 42 and is exposed externally.

As illustrated in FIG. 2, when viewed from the Z-direction, the multiple p$^-$-type ring-shaped regions 10 are provided to overlap the gap between the upper electrode 22 and the conductive layer 30, the gaps between the conductive layers 30, and the gap between the conductive layer 30 and the EQPR electrode 23.

Specifically, as illustrated in FIG. 3, the multiple p$^-$-type ring-shaped regions 10 include a p$^-$-type ring-shaped region 10a (an example of a first ring-shaped region), a p$^-$-type ring-shaped region 10b (an example of a second ring-shaped region), a p⁻-type ring-shaped region 10c (an example of a third ring-shaped region), and a p⁻-type ring-shaped region 10d. The multiple conductive layers 30 include a conductive layer 30a (an example of a first conductive layer), a conductive layer 30b (an example of a second conductive layer), and a conductive layer 30c. The n⁻-type semiconductor region 1 includes a region 1a, a region 1b (an example of a first region), a region 1c (an example of a second region), a region 1d, and a region 1e.

The region 1a is positioned between the p-type semiconductor region 2 and the p⁻-type ring-shaped region 10a. The p⁻-type ring-shaped regions 10a to 10d and the regions 1b to 1d are provided alternately in the diametrical direction. The region 1e is positioned between the p⁻-type ring-shaped region 10d and the n⁺-type EQPR region 3. The conductive layers 30a to 30c are positioned respectively on the regions 1b to 1d.

For example, the p⁻-type ring-shaped region 10a is next to the p-type semiconductor region 2 with the region 1a interposed. The p⁻-type ring-shaped region 10b surrounds the p⁻-type ring-shaped region 10a and is next to the p⁻-type ring-shaped region 10a with the region 1b interposed. The conductive layer 30a is next to the upper electrode 22 with a portion of the semi-insulating layer 41 interposed. The conductive layer 30b surrounds the conductive layer 30a and is next to the conductive layer 30a with another portion of the semi-insulating layer 41 interposed.

The conductive layer 30a is provided on the outer perimeter of the p⁻-type ring-shaped region 10a, the inner perimeter of the p⁻-type ring-shaped region 10b, and the region 1b. Therefore, a length L1 in the diametrical direction of the conductive layer 30a is longer than a distance D1 in the diametrical direction between the p⁻-type ring-shaped region 10a and the p⁻-type ring-shaped region 10b. The p⁻-type ring-shaped region 10b is provided under the outer perimeter of the conductive layer 30a, the inner perimeter of the conductive layer 30b, and the semi-insulating layer 41 between the conductive layer 30a and the conductive layer 30b. Therefore, a length L2 in the diametrical direction of the p⁻-type ring-shaped region 10b is longer than a distance D2 in the diametrical direction between the conductive layer 30a and the conductive layer 30b.

Operations of the semiconductor device 100 will now be described.

When a voltage that is positive with respect to the lower electrode 21 is applied to the upper electrode 22, a forward voltage is applied to the p-n junction surface between the n⁻-type semiconductor region 1 and the p-type semiconductor region 2. Thereby, the semiconductor device 100 is set to the ON-state; and a current flows from the upper electrode 22 toward the lower electrode 21.

Subsequently, when a voltage that is positive with respect to the upper electrode 22 is applied to the lower electrode 21, the flow of the current stops; and the semiconductor device 100 switches from the ON-state to the OFF-state. A reverse voltage is applied to the p-n junction surface between the n⁻-type semiconductor region 1 and the p-type semiconductor region 2. Due to the application of the reverse voltage, a depletion layer spreads from the p-n junction surface between the n⁻-type semiconductor region 1 and the p-type semiconductor region 2.

When the depletion layer spreading from the p-type semiconductor region 2 reaches the p⁻-type ring-shaped regions 10, a reverse voltage is applied also between the n⁻-type semiconductor region 1 and the p⁻-type ring-shaped regions 10. Thereby, the depletion layer spreads from the p-n junction surfaces between the n⁻-type semiconductor region 1 and the p⁻-type ring-shaped regions 10. Due to the spreading of the depletion layer from the p⁻-type ring-shaped regions 10, electric field concentration at the outer perimeter of the p-type semiconductor region 2 can be suppressed; and the breakdown voltage of the semiconductor device 100 can be increased.

When the semiconductor device 100 is in the OFF-state, the potential of the EQPR electrode 23 is substantially the same as the potential of the lower electrode 21. The upper electrode 22 and the EQPR electrode 23 are electrically connected to each other via the multiple conductive layers 30 and the semi-insulating layer 41. Therefore, a micro current flows from the EQPR electrode 23 toward the upper electrode 22 via the multiple conductive layers 30 and the semi-insulating layer 41. The potentials of the conductive layers 30 are fixed according to the flow of the current. The potentials of the conductive layers 30 affect the spreading of the depletion layer toward the outer perimeter of the semiconductor layer SL. By fixing the potentials of the conductive layers 30, for example, the spreading of the depletion layer in the semiconductor layer SL can be stable; and the reliability of the semiconductor device 100 can be increased.

Examples of the materials of the components of the semiconductor device 100 will now be described.

The n⁻-type semiconductor region 1, the p-type semiconductor region 2, the n⁺-type EQPR region 3, the n⁺-type contact region 4, the p⁺-type contact region 5, and the p⁻-type ring-shaped region 10 include silicon, silicon carbide, gallium nitride, or gallium arsenide as semiconductor materials. In the case where silicon is used as the semiconductor material, arsenic, phosphorus, or antimony can be used as an n-type impurity. Boron can be used as a p-type impurity.

The lower electrode 21, the upper electrode 22, and the EQPR electrode 23 include a metal such as aluminum, copper, etc.

The conductive layer 30 includes a metal such as aluminum, copper, etc. The conductive layer 30 may include polysilicon including a high concentration of an impurity.

The insulating layer 40 includes an insulating material such as silicon oxide, silicon nitride, etc.

The semi-insulating layer 41 includes an insulating material such as silicon oxide, silicon nitride, etc. The semi-insulating layer 41 may include an amorphous carbon structure substance including a hydrocarbon and a carbon allotrope as the insulating material. However, the electrical resistance of the semi-insulating layer 41 is lower than the electrical resistance of the insulating layer 40. For example, the resistivity of the semi-insulating layer 41 is not less than $1.0 \times 40^8$ (Ω·cm) but less than $1.0 \times 10^{13}$ (Ω·cm). The resistivity of the insulating layer 40 is $1.0 \times 10^{13}$ (Ω·cm) or more.

The insulating portion 42 includes an insulating resin material such as polyimide, etc.

Effects of the first embodiment will now be described with reference to FIG. 4 to FIG. 6.

Figure 4:
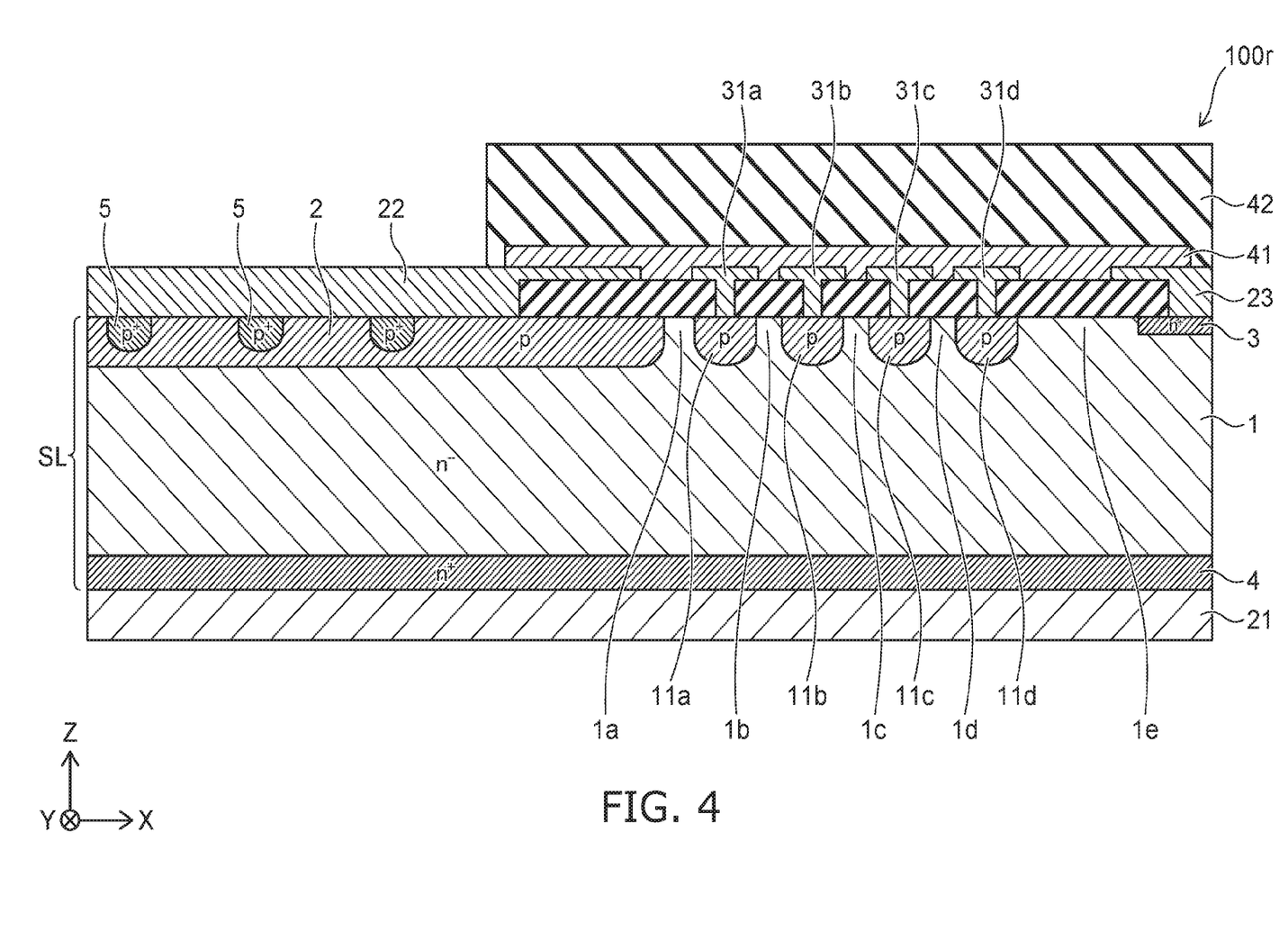
FIG. 4 is a cross-sectional view illustrating a portion of a semiconductor device according to a reference example.

FIG. 4 is a cross-sectional view illustrating a portion of a semiconductor device according to a reference example. FIG. 5A and FIG. 5B are graphs respectively illustrating characteristics of the semiconductor devices according to the reference example and the first embodiment. FIG. 6 is a graph illustrating characteristics of the semiconductor devices according to the reference example and the first embodiment.

As illustrated in FIG. 4, the semiconductor device 100r according to the reference example includes conductive layers 31a to 31d instead of the conductive layers 30a to 30c. The conductive layers 31a to 31d are provided respectively on p-type ring-shaped regions 11a to 11d and are directly connected electrically to the p-type ring-shaped regions 11a to 11d. The conductive layers 31a to 31d also are electrically connected to the upper electrode 22 and the EQPR electrode 23 via the semi-insulating layer 41.

Effect 1

When the semiconductor device 100r is in the OFF-state, an electric field is generated at the outer perimeter of the semiconductor device 100r. A portion of an external charge existing in the insulating portion 42 and/or outside the semiconductor device 100r is attracted toward the semiconductor layer SL by the electric field. For example, an electric field is generated by the attracted external charge when the external charge is stored at the semi-insulating layer 41 vicinity of the insulating portion 42. When the electric field generated by the external charge reaches the semiconductor layer SL, a charge is stored at the upper surface of the semiconductor layer SL. The stored charge affects the spreading of the depletion layer. As a result, the spreading of the depletion layer in the semiconductor layer SL fluctuates; and the breakdown voltage decreases.

In the semiconductor device 100r, a portion of the electric field generated by the external charge is shielded by the conductive layers 31a to 31d. On the other hand, the upper electrode 22, the conductive layers 31a to 31d, and the EQPR electrode 23 are separated from each other in the diametrical direction. The electric field due to the external charge is unshielded at the gaps respectively between the upper electrode 22, the conductive layers 31a to 31d, and the EQPR electrode 23. Therefore, a charge is stored at the upper surface of the n⁻-type semiconductor region 1 positioned under each gap due to the electric field of the external charge. In other words, by providing the conductive layers 31a to 31d, the fluctuation of the breakdown voltage of the semiconductor device 100r can be suppressed; but the decrease of the breakdown voltage caused by the external charge still occurs.

In the semiconductor device 100, the p⁻-type ring-shaped regions 10a to 10d are provided respectively under the gaps between the upper electrode 22, the conductive layers 30a to 30c, and the EQPR electrode 23. Therefore, charge is stored in the p⁻-type ring-shaped regions 10a to 10d due to the electric field of the external charge. The p-type impurity concentrations in the p⁻-type ring-shaped regions 10 are higher than the n-type impurity concentration in the n⁻-type semiconductor region 1; and the p⁻-type ring-shaped regions 10 do not deplete completely when the semiconductor device 100 is in the OFF-state. When the charge is stored in regions where the p⁻-type ring-shaped regions 10 are not depleted, compared to when the charge is stored in the depleted n⁻-type semiconductor region 1, the charge has a small effect on the spreading of the depletion layer. Therefore, according to the first embodiment, the decrease of the breakdown voltage of the semiconductor device 100 due to the external charge can be suppressed.

Effect 2

In the semiconductor device 100, junction capacitances are formed respectively between the n⁻-type semiconductor region 1 and the p⁻-type ring-shaped regions 10a to 10d. In the semiconductor device 100r, junction capacitances are formed respectively between the n⁻-type semiconductor region 1 and the p-type ring-shaped regions 11a to 11d. These junction capacitances are charged when the semiconductor devices 100 and 100r are turned OFF and are discharged when the semiconductor devices 100 and 100r are turned ON. When the semiconductor devices 100 and 100r are turned OFF, the potentials of the p⁻-type ring-shaped regions 10a to 10d and the p-type ring-shaped regions 11a to 11d are temporarily unstable until the junction capacitances are charged. If the time until the junction capacitances are charged is long, the time necessary for the breakdown voltage to stabilize lengthens. Therefore, it is desirable for the time necessary for the junction capacitances to charge or discharge to be short.

A time constant T that indicates the time until the junction capacitances complete charging or discharging is represented by the product of a capacitance C and a resistance R. In the semiconductor device 100r, the p-type ring-shaped regions 11a to 11d respectively are directly connected electrically to the conductive layers 31a to 31d; and the conductive layers 31a to 31d are electrically connected to the upper electrode 22 and the EQPR electrode 23 via the semi-insulating layer 41. Compared to the conductive layers 31a to 31d, the electrical resistance of the semi-insulating layer 41 is markedly high. The time constant T increases as the electrical resistance increases. Therefore, in the semiconductor device 100r, the time until the junction capacitances complete charging or discharging is long.

In the semiconductor device 100, the conductive layers 30a to 30c are provided on the p⁻-type ring-shaped regions 10a to 10d with the insulating layer 40 interposed. The conductive layers 30a to 30c are not directly connected electrically to the p⁻-type ring-shaped regions 10a to 10d. Thereby, the junction capacitances respectively between the n⁻-type semiconductor region 1 and the p⁻-type ring-shaped regions 10a to 10d are separated from the electrical resistance of the semi-insulating layer 41 in the electrical path between the lower electrode 21 and the upper electrode 22. Accordingly, the effect of the electrical resistance of the semi-insulating layer 41 on the charging or the discharging of the junction capacitances can be excluded. According to the semiconductor device 100, compared to the semiconductor device 100r, the time constant T can be greatly reduced. As a result, when the semiconductor device 100 is turned OFF, the time of the decrease of the breakdown voltage can be shortened.

Figure 5A:
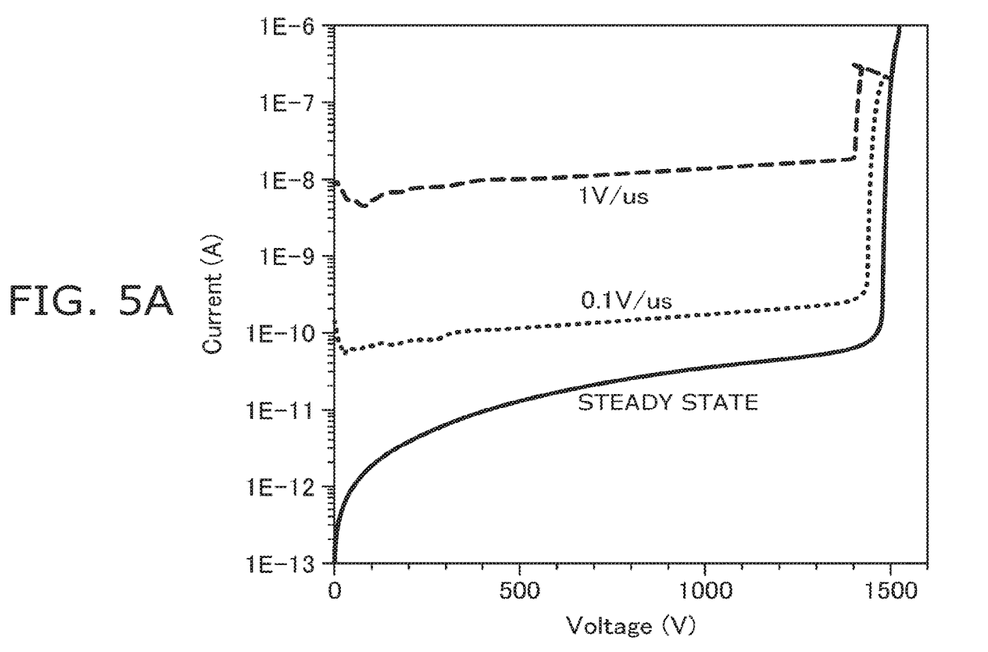
FIG. 5A and FIG. 5B are graphs respectively illustrating characteristics of the semiconductor devices according to the reference example and the first embodiment.

FIG. 5A illustrates characteristics of the semiconductor device according to the reference example. FIG. 5B illustrates characteristics of the semiconductor device according to the first embodiment. In FIG. 5A and FIG. 5B, the horizontal axis is the voltage of the lower electrode 21 with respect to the upper electrode 22. The vertical axis is the current flowing from the lower electrode 21 toward the upper electrode 22. The solid line illustrates the current at each voltage in a steady state in which the voltage does not change. The dotted line illustrates the current at each voltage when the voltage is increased at 0.1 V/µs. The broken line illustrates the current at each voltage when the voltage is increased at 1 V/µs. The current of the vertical axis is the sum of the leakage current flowing from the lower electrode 21 toward the upper electrode 22 and the displacement current due to the change of the voltage.

In the semiconductor device 100r according to the reference example as illustrated in FIG. 5A, breakdown occurs at about 1500 V in the steady state; and the current increases abruptly. On the other hand, when the voltage is increased at 0.1 V/µs, breakdown occurs at about 1450 V. When the voltage is increased at 1 V/µs, breakdown occurs at about 1400 V. In each case, after a preliminary breakdown occurs and the current increases, the current does not change greatly and approaches the characteristic of the steady state even when the voltage is increased. Then, similarly to the steady state, the current increases again when a voltage of about 1500 V is reached.

Figure 5B:
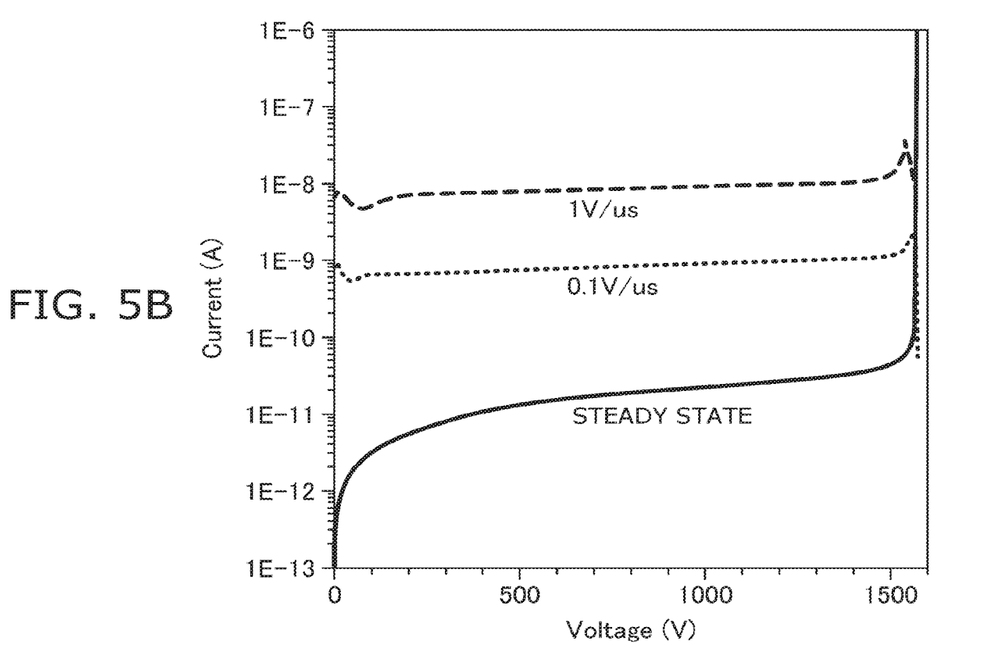

In the semiconductor device 100 according to the first embodiment as illustrated in FIG. 5B, breakdown occurs at about 1550 V in the steady state or when the voltage is increased at 0.1 V/μs. When the voltage is increased at 1 V/μs, breakdown occurs at about 1520 V. After a preliminary breakdown occurs and the current increases, similarly to FIG. 5A, the current does not change greatly and approaches the characteristic of the steady state even when the voltage is increased.

Comparing FIG. 5A and FIG. 5B, it can be seen that the increase value of the current when the preliminary breakdown occurs in the semiconductor device 100 according to the first embodiment is small compared to that of the semiconductor device 100r according to the reference example. This shows that in the semiconductor device 100, compared to the semiconductor device 100r, the time necessary for charging the junction capacitances is short; and the time until the breakdown voltage stabilizes is short. Also, in the semiconductor device 100, compared to the semiconductor device 100r, it can be seen that the decrease of the breakdown voltage when the voltage fluctuates is small.

Effect 3

When the semiconductor device 100 is turned OFF, a depletion layer spreads from the p-type semiconductor region 2 toward the outer perimeter. At this time, the potential of the region of the n⁻-type semiconductor region 1 where the depletion layer does not spread is equal to the potential of the lower electrode 21. On the other hand, a depletion layer starts to spread from the EQPR electrode 23 toward the upper electrode 22; and a current flows. In other words, a voltage drop occurs from the EQPR electrode 23 toward the upper electrode 22. Therefore, the potentials of the upper electrode 22 and the conductive layers 30a to 30c are respectively lower than the potentials of the regions 1a to 1d of the n⁻-type semiconductor region 1 positioned respectively under the upper electrode 22 and the conductive layers 30a to 30c. Due to the potential difference, holes are stored at the upper surfaces of the regions 1a to 1d; and p-type channels are formed. The p⁻-type ring-shaped regions 10a to 10d and the p-type semiconductor region 2 are electrically connected to each other by the p-type channels.

For example, when impact ionization occurs at the lower ends of the p⁻-type ring-shaped regions 10 and avalanche breakdown occurs, a large current flows at the p⁻-type ring-shaped region 10 vicinity. At this time, holes flow toward the p-type semiconductor region 2 via the p-type channels formed at the upper surfaces of the regions 1a to 1d. A voltage drop occurs when the holes flow through the p-type channels and the p⁻-type ring-shaped regions 10. In other words, the potentials of the p⁻-type ring-shaped regions 10 increase where the avalanche breakdown occur. When the potentials of the p⁻-type ring-shaped regions 10 increase, the potential difference between the n⁻-type semiconductor region 1 and the p⁻-type ring-shaped regions 10 becomes small; and impact ionization does not occur easily. In other words, the p-type channels that are formed at the upper surfaces of the regions 1a to 1d function as limiting resistance for suppressing the flow of an excessive current. Therefore, when the avalanche breakdown occurs, the continuous flow of a large current in a portion of the semiconductor device 100 can be suppressed; and the likelihood of breakdown occurring in the semiconductor device 100 can be reduced. In other words, according to the first embodiment, the avalanche resistance of the semiconductor device 100 can be improved.

Figure 6:
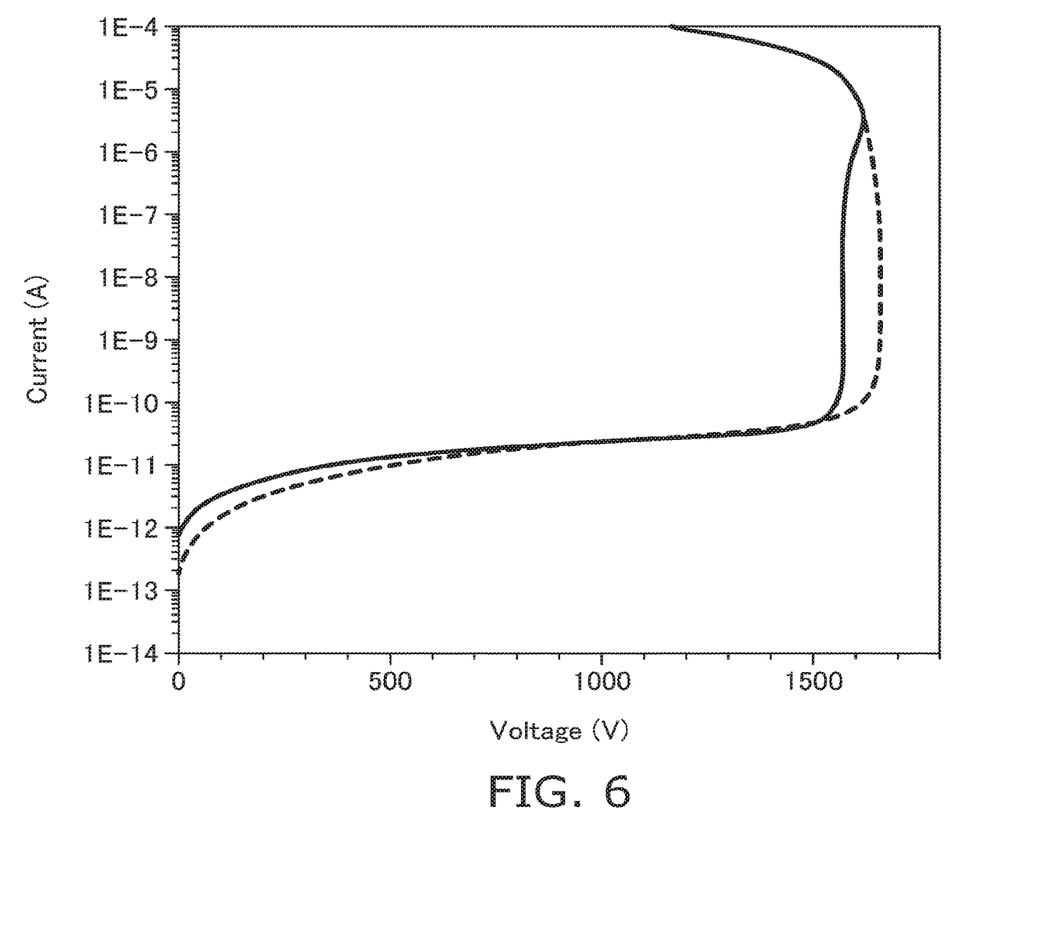
FIG. 6 is a graph illustrating characteristics of the semiconductor devices according to the reference example and the first embodiment.

In FIG. 6, the solid line illustrates a characteristic of the semiconductor device 100 according to the first embodiment; and the broken line illustrates a characteristic of the semiconductor device 100r according to the reference example. The horizontal axis illustrates the voltage of the lower electrode 21 with respect to the upper electrode 22. The vertical axis illustrates the current flowing from the lower electrode 21 toward the upper electrode 22.

At about 1550 V in the semiconductor device 100r according to the reference example, a preliminary breakdown occurs; and the current increases. Subsequently, the voltage decreases gradually while the current increases. In other words, a negative correlation occurs between the change of the voltage and the change of the current. Finally, the voltage greatly decreases while the current increases; and a secondary breakdown occurs. This shows that when breakdown occurs in a designated region, the current increases limitlessly in the region.

On the other hand, at about 1530 V in the semiconductor device 100 according to the first embodiment, breakdown occurs; and the current increases. Subsequently, before a secondary breakdown occurs, the current increases as the voltage increases. As described above, this shows that the p-type channels formed at the regions 1a to 1d function as limiting resistances.

As described above, according to the first embodiment, the decrease of the breakdown voltage of the semiconductor device 100 due to the external charge, the decrease of the breakdown voltage of the semiconductor device 100 at turn-off, and the improvement of avalanche resistance of the semiconductor device 100 are possible; and the reliability of the semiconductor device 100 can be increased.

It is favorable for the p-type total impurity amount in the p⁻-type ring-shaped regions 10 to be not less than $0.5 \times 10^{13}$ atoms/cm² and not more than $3.0 \times 10^{13}$ atoms/cm². The total impurity amount is the integral of the impurity concentration in the Z-direction per unit area of the X-Y plane. By setting the total impurity amount to be within this range, when the semiconductor device 100 is in the OFF-state, the depletion layer can spread to the p⁻-type ring-shaped regions 10 in an area such that the p⁻-type ring-shaped regions 10 do not deplete completely. The electric field intensity in the depletion layer decreases as the depletion layer spreads to the p⁻-type ring-shaped regions 10. Therefore, the likelihood of impact ionization occurring in the p⁻-type ring-shaped regions 10 can be reduced; and the flow of a large current when the avalanche breakdown occurs can be suppressed.

In the example illustrated in FIG. 1 to FIG. 3, each of the multiple conductive layers 30 is provided on two mutually-adjacent p⁻-type ring-shaped regions 10 and a portion of the n⁻-type semiconductor region 1 positioned between the two p⁻-type ring-shaped regions 10. The structure of the semiconductor device 100 is not limited to the example. For example, only a portion of the multiple conductive layers 30 may be provided on two mutually-adjacent p⁻-type ring-shaped regions 10 and a portion of the n⁻-type semiconductor region 1 positioned between the two p⁻-type ring-shaped regions 10. In such a case as well, compared to the semiconductor device 100r according to the reference example illustrated in FIG. 4, the reliability of the semiconductor device can be increased. However, to improve the reliability of the semiconductor device 100 further, the structure illustrated in FIG. 1 to FIG. 3 is favorable.

First Modification

Figure 7:
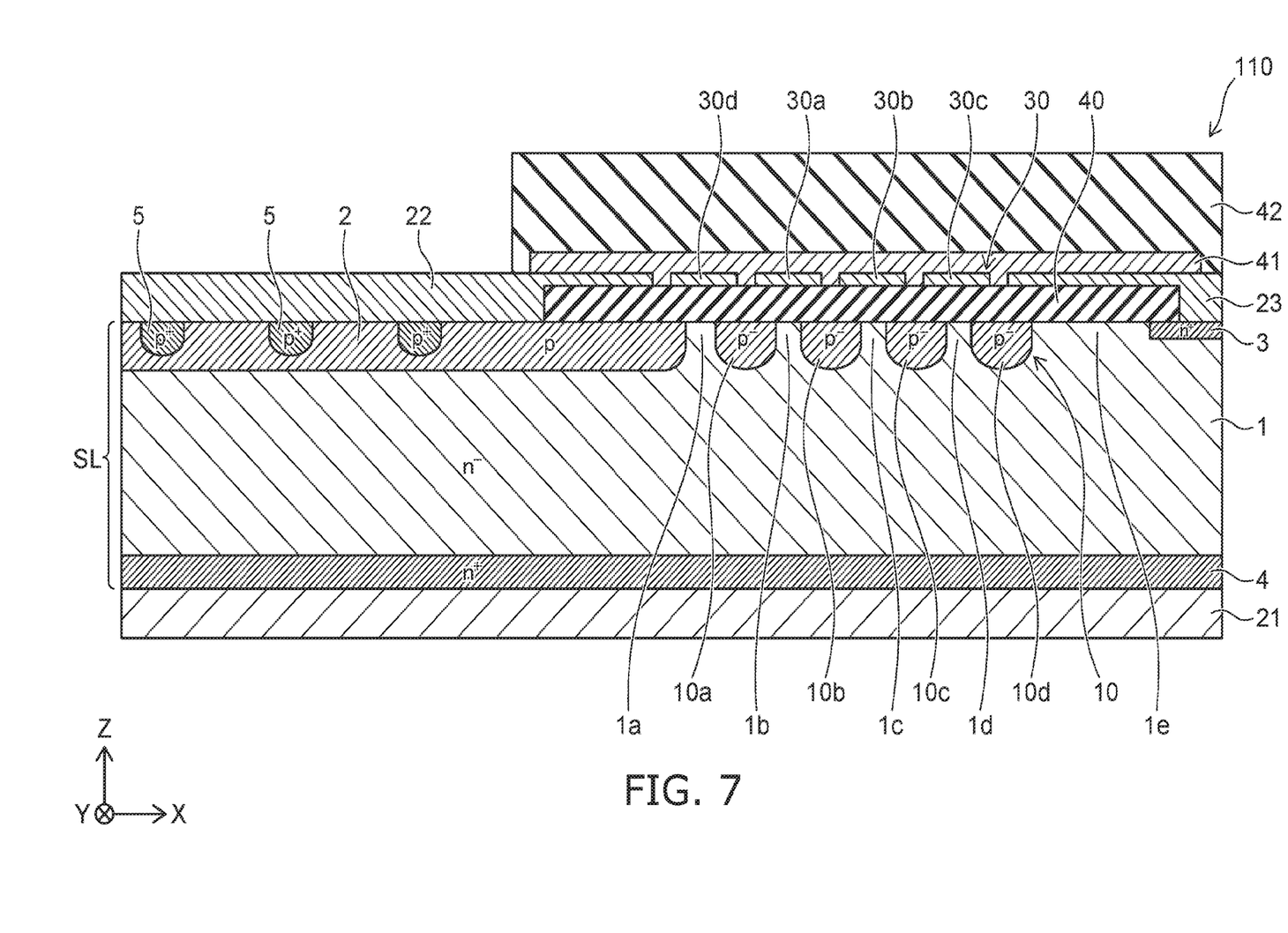
FIG. 7 is a cross-sectional view illustrating a portion of a semiconductor device according to a first modification of the first embodiment.

FIG. 7 is a cross-sectional view illustrating a portion of a semiconductor device according to a first modification of the first embodiment.

The semiconductor device 110 according to the first modification differs from the semiconductor device 100 in that a conductive layer 30d is further provided as illustrated in FIG. 7.

The conductive layer 30d is provided on the outer perimeter of the p-type semiconductor region 2, the region 1a, and the inner perimeter of the p$^-$-type ring-shaped region 10a with the insulating layer 40 interposed. The conductive layer 30d is positioned between the upper electrode 22 and the conductive layer 30a and surrounds the upper electrode 22. The conductive layer 30d is separated from the upper electrode 22 and the conductive layer 30a. The upper electrode 22, the conductive layers 30a to 30d, and the EQPR electrode 23 are electrically connected to each other via the semi-insulating layer 41.

According to the first modification, similarly to the semiconductor device 100 according to the first embodiment, the reliability of the semiconductor device 110 can be increased.

In other words, in the semiconductor device 110, the p-type semiconductor region 2 is provided under the gap between the upper electrode 22 and the conductive layer 30d. The p$^-$-type ring-shaped region 10a is provided between the conductive layer 30d and the conductive layer 30a. Therefore, the decrease of the breakdown voltage of the semiconductor device 110 due to the external charge can be suppressed.

The conductive layer 30d is provided on the p-type semiconductor region 2, the region 1a, and the p$^-$-type ring-shaped region 10a with the insulating layer 40 interposed. Therefore, when the semiconductor device 110 is turned OFF, the time of the decrease of the breakdown voltage can be shortened.

When the semiconductor device 110 is turned OFF, a p-type channel is formed at the upper surface of the region 1a by the potential difference between the region 1a and the conductive layer 30d. Because the p-type channel functions as a limiting resistance, the avalanche resistance of the semiconductor device 110 can be improved.

Second Modification

Figure 8:
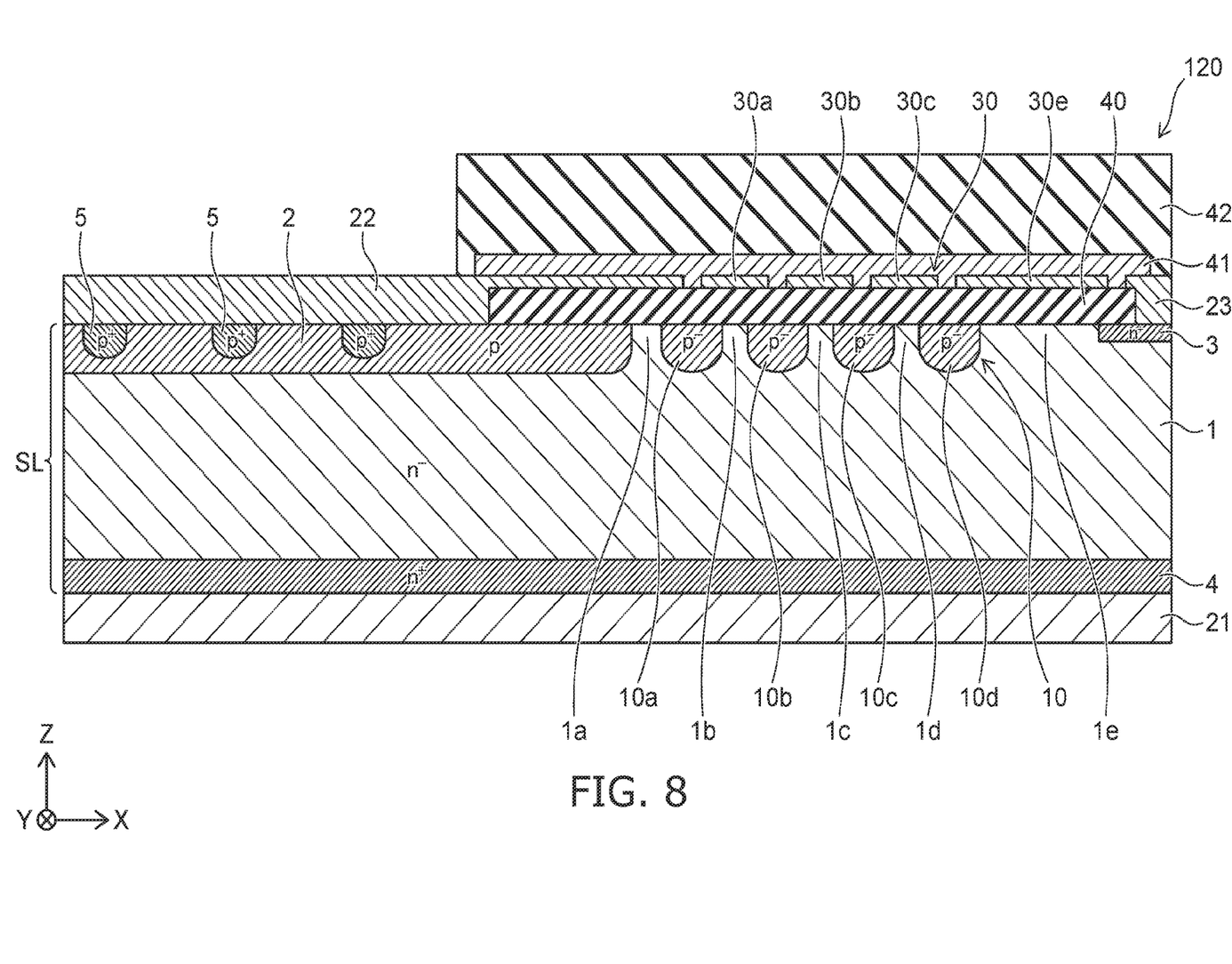
FIG. 8 is a cross-sectional view illustrating a portion of a semiconductor device according to a second modification of the first embodiment.

FIG. 8 is a cross-sectional view illustrating a portion of a semiconductor device according to a second modification of the first embodiment.

The semiconductor device 120 according to the second modification differs from the semiconductor device 100 in that a conductive layer 30e is further provided as illustrated in FIG. 8.

The conductive layer 30e is provided on the outer perimeter of the p$^-$-type ring-shaped region 10d, the region 1e, and the inner perimeter of the n$^+$-type EQPR region 3 with the insulating layer 40 interposed. The conductive layer 30e is positioned between the conductive layer 30c and the EQPR electrode 23 and surrounds the conductive layer 30c. The conductive layer 30e is separated from the conductive layer 30c and the EQPR electrode 23. The upper electrode 22, the conductive layers 30a to 30c, the conductive layer 30e, and the EQPR electrode 23 are electrically connected to each other via the semi-insulating layer 41.

According to the second modification, similarly to the semiconductor device 100 according to the first embodiment, the reliability of the semiconductor device 120 can be increased.

In the semiconductor device 120, the p$^-$-type ring-shaped region 10d is provided under the gap between the conductive layer 30c and the conductive layer 30e. The n$^+$-type EQPR region 3 is provided under the gap between the conductive layer 30e and the EQPR electrode 23. Therefore, the decrease of the breakdown voltage of the semiconductor device 120 due to the external charge can be suppressed.

The conductive layer 30e is provided on the p$^-$-type ring-shaped region 10d, the region 1e, and the n$^+$-type EQPR region 3 with the insulating layer 40 interposed. Therefore, when the semiconductor device 120 is turned OFF, the time of the decrease of the breakdown voltage can be shortened.

When the semiconductor device 120 is turned OFF, a p-type channel is formed at the upper surface of the region 1e by the potential difference between the region 1e and the conductive layer 30e. Because the p-type channel functions as a limiting resistance, the avalanche resistance of the semiconductor device 120 can be improved.

Second Embodiment

Figure 9:
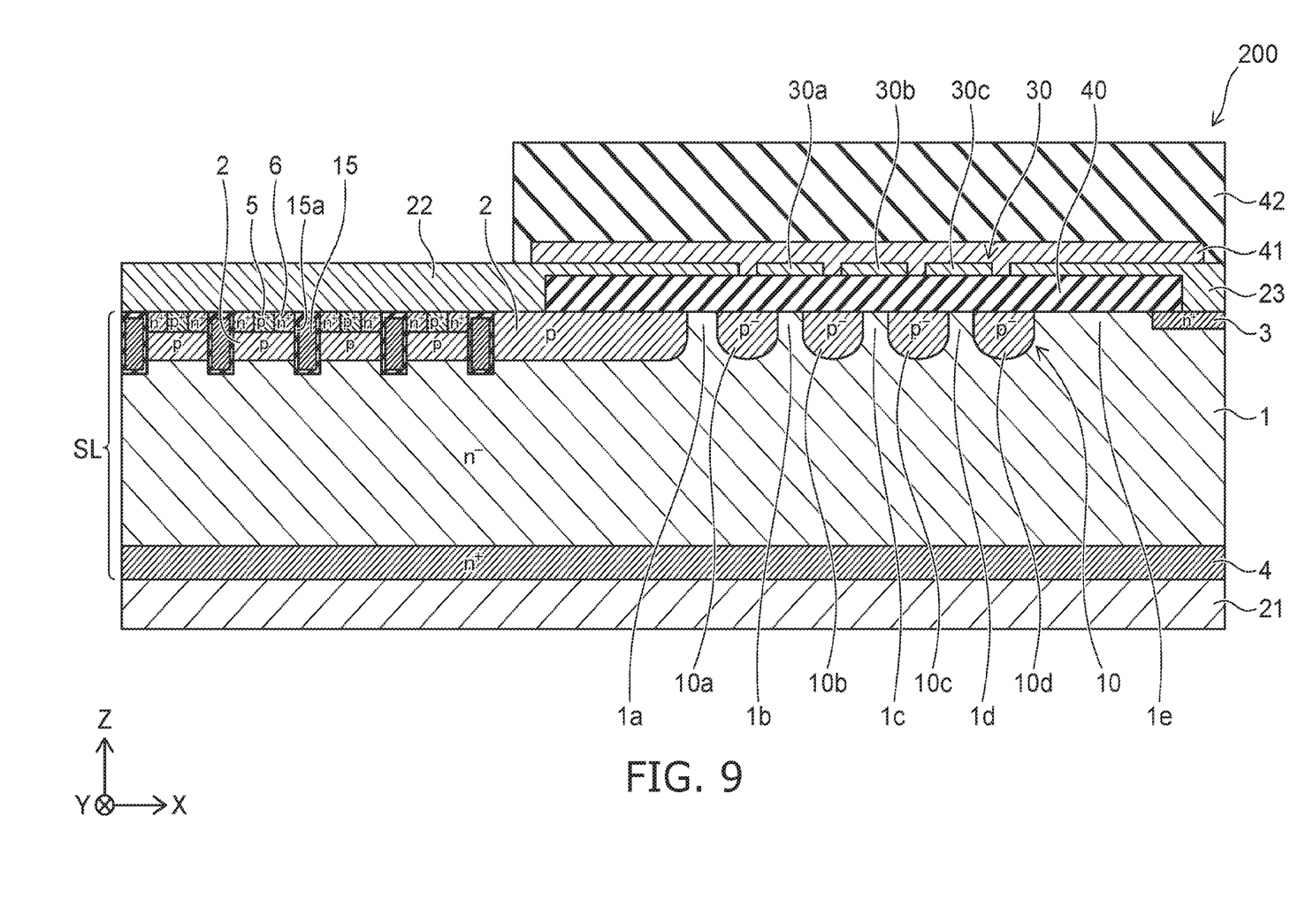
FIG. 9 is a cross-sectional view illustrating a portion of a semiconductor device according to a second embodiment.

FIG. 9 is a cross-sectional view illustrating a portion of a semiconductor device according to a second embodiment.

The semiconductor device 200 according to the second embodiment is a MOSFET. As illustrated in FIG. 9, compared to the semiconductor device 100, the semiconductor device 200 further includes an n$^+$-type source region 6 (a fourth semiconductor region) and a gate electrode 15.

The p$^+$-type contact region 5 and the n$^+$-type source region 6 are provided selectively on the p-type semiconductor region 2. The gate electrode 15 opposes the p-type semiconductor region 2 with a gate insulating layer 15a interposed. In the example illustrated in FIG. 9, the gate electrode 15 also opposes the n$^+$-type source region 6 and a portion of the n$^-$-type semiconductor region 1. For example, pluralities are provided in the X-direction for the p-type semiconductor region 2, the p$^+$-type contact region 5, the n$^+$-type source region 6, and the gate electrode 15; and these components extend in the Y-direction.

Operations of the semiconductor device 200 will now be described.

A voltage that is not less than a threshold is applied to the gate electrode 15 in a state in which a voltage that is positive with respect to the upper electrode 22 is applied to the lower electrode 21. Thereby, a channel (an inversion layer) is formed in the p-type semiconductor region 2; and the semiconductor device 200 is set to the ON-state. Electrons flow from the upper electrode 22 toward the lower electrode 21 via the channel. Subsequently, when the voltage applied to the gate electrode 15 becomes lower than the threshold, the channel in the p-type semiconductor region 2 disappears; and the semiconductor device 200 is set to the OFF-state.

The structures of the p$^-$-type ring-shaped region 10, the conductive layer 30, and the semi-insulating layer 41 of the semiconductor device 200 are similar to those of the semiconductor device 100. Therefore, according to the second embodiment, similarly to the first embodiment, the decrease of the breakdown voltage of the semiconductor device 200 due to the external charge, the decrease of the breakdown voltage of the semiconductor device 200 at turn-off, and the improvement of the avalanche resistance of the semiconductor device 200 are possible; and the reliability of the semiconductor device 200 can be increased.

Third Embodiment

Figure 10:
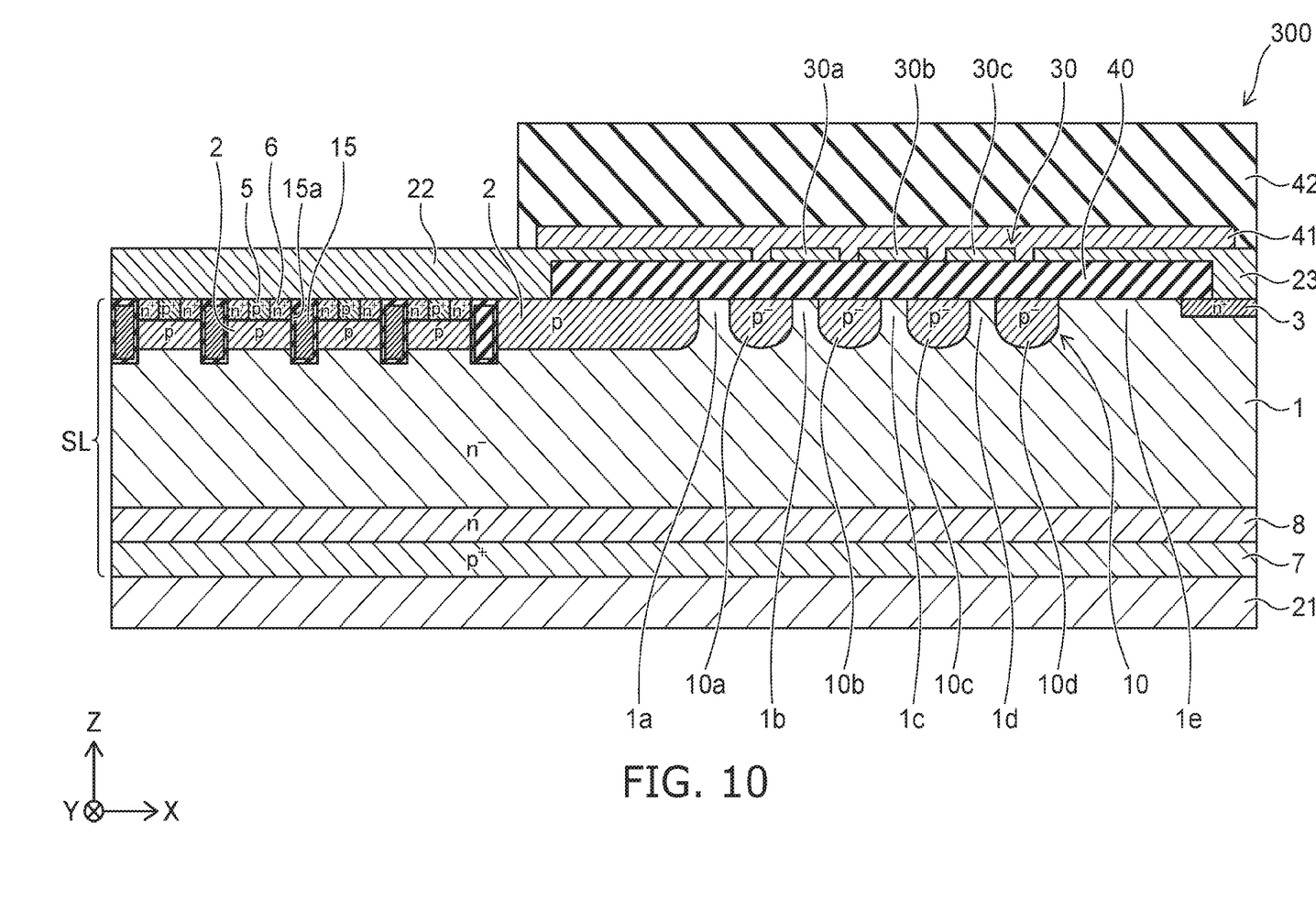
FIG. 10 is a cross-sectional view illustrating a portion of a semiconductor device according to a third embodiment.

FIG. 10 is a cross-sectional view illustrating a portion of a semiconductor device according to a third embodiment.

The semiconductor device 300 according to the third embodiment is an IGBT. As illustrated in FIG. 10, compared to the semiconductor device 100, the semiconductor device 300 further includes the n$^+$-type source region 6, a p$^+$-type collector region 7 (a fifth semiconductor region), an n-type buffer region 8, and the gate electrode 15.

The semiconductor device 300 is an IGBT. The semiconductor device 300 differs from the semiconductor device 200 in that the p$^+$-type collector region 7 (the fifth semiconductor region) and the n-type buffer region 8 are included instead of the n$^+$-type contact region 4. The p$^+$-type collector region 7 is provided between the lower electrode 21 and the n$^-$-type semiconductor region 1. The n-type buffer region 8 is provided between the p$^+$-type collector region 7 and the n$^-$-type semiconductor region 1. The n-type impurity concentration in the n-type buffer region 8 is higher than the n-type impurity concentration in the n$^-$-type semiconductor region 1 and lower than the n-type impurity concentration in the n$^+$-type source region 6.

Operations of the semiconductor device 300 will now be described.

A voltage that is not less than a threshold is applied to the gate electrode 15 in a state in which a voltage that is positive with respect to the upper electrode 22 is applied to the lower electrode 21. Thereby, a channel (an inversion layer) is formed in the p-type semiconductor region 2; and the semiconductor device 200 is set to the ON-state. When electrons flow from the upper electrode 22 toward the n$^-$-type semiconductor region 1 via the channel, holes are injected from the p$^+$-type collector region 7 into the n$^-$-type semiconductor region 1. The electrical resistance of the semiconductor device 300 decreases greatly due to conductivity modulation occurring in the n$^-$-type semiconductor region 1. Subsequently, when the voltage applied to the gate electrode 15 becomes lower than the threshold, the channel in the p-type semiconductor region 2 disappears; and the semiconductor device 300 is set to the OFF-state.

The structures of the p$^-$-type ring-shaped region 10, the conductive layer 30, and the semi-insulating layer 41 of the semiconductor device 300 are similar to those of the semiconductor device 100. Therefore, according to the third embodiment, similarly to the first embodiment, the decrease of the breakdown voltage of the semiconductor device 300 due to the external charge, the decrease of the breakdown voltage of the semiconductor device 300 at turn-off, and the improvement of the avalanche resistance of the semiconductor device 200 are possible; and the reliability of the semiconductor device 300 can be increased.

The semiconductor device illustrated in FIG. 9 and FIG. 10 has a trench-gate structure in which the gate electrode 15 is provided inside the semiconductor layer SL. The semiconductor devices according to the second embodiment and the third embodiment may have planar-gate structures in which the gate electrode 15 is provided on the semiconductor layer SL. As long as the semiconductor devices according to the second embodiment and the third embodiment can operate respectively as a MOSFET and an IGBT, the specific structures of the p-type semiconductor region 2, the p$^+$-type contact region 5, the n$^+$-type source region 6, and the gate electrode 15 are modifiable as appropriate.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. It is possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a first semiconductor region provided on the first electrode and electrically connected to the first electrode, the first semiconductor region being of a first conductivity type;
   a second semiconductor region provided on the first semiconductor region, the second semiconductor region being of a second conductivity type;
   a third semiconductor region surrounding the second semiconductor region, the third semiconductor region being provided on the first semiconductor region, the third semiconductor region being of the first conductivity type, an impurity concentration of the first conductivity type in the third semiconductor region being higher than an impurity concentration of the first conductivity type in the first semiconductor region;
   a first ring-shaped region surrounding the second semiconductor region, the first ring-shaped region being provided between the second semiconductor region and the third semiconductor region, the first ring-shaped region being separated from the second semiconductor region and the third semiconductor region, the first ring-shaped region being of the second conductivity type;
   a second ring-shaped region surrounding the first ring-shaped region, the second ring-shaped region being provided between the first ring-shaped region and the third semiconductor region, the second ring-shaped region being separated from the first ring-shaped region and the third semiconductor region, the second ring-shaped region being of the second conductivity type;
   a second electrode provided on the second semiconductor region and electrically connected to the second semiconductor region;
   a third electrode surrounding the second electrode, the third electrode being provided on the third semiconductor region, the third electrode being electrically connected to the third semiconductor region;
   a first conductive layer surrounding the second electrode, the first conductive layer being separated from the second electrode and the third electrode, the first conductive layer being provided on the first ring-shaped region, the second ring-shaped region, and a first region of the first semiconductor region with an insulating layer interposed, the first region being positioned between the first ring-shaped region and the second ring-shaped region; and
   a semi-insulating layer contacting the second electrode, the first conductive layer, and the third electrode.

2. The device according to claim 1, further comprising:
   a third ring-shaped region surrounding the second ring-shaped region, the third ring-shaped region being provided between the second ring-shaped region and the third semiconductor region, the third ring-shaped region being separated from the second ring-shaped region and the third semiconductor region, and being of the second conductivity type;

a second conductive layer surrounding the first conductive layer, the second conductive layer being separated from the first conductive layer and the third electrode, the second conductive layer being provided on the second ring-shaped region, the third ring-shaped region, and a second region of the first semiconductor region with the insulating layer interposed, the second region being positioned between the second ring-shaped region and the third ring-shaped region.

3. The device according to claim 1, wherein a total impurity amount of the second conductivity type in the second semiconductor region is not less than $0.5\times10^{13}$ atoms/cm$^2$ and not more than $3.0\times10^{13}$ atoms/cm$^2$.

4. The device according to claim 1, wherein a resistivity of the semi-insulating layer is not less than $1.0\times10^8$ ($\Omega\cdot$cm) but less than $1.0\times10^{13}$ ($\Omega\cdot$cm).

5. The device according to claim 1, further comprising:
a fourth semiconductor region provided on the second semiconductor region, the fourth semiconductor region being of the first conductivity type; and
a gate electrode opposing the second semiconductor region with a gate insulating layer interposed.

6. The device according to claim 5, further comprising a fifth semiconductor region provided between the first electrode and the first semiconductor region, the fifth semiconductor region being of the second conductivity type.

7. A semiconductor device, comprising:
a first electrode;
a first semiconductor region provided on the first electrode and electrically connected to the first electrode, the first semiconductor region being of a first conductivity type;
a second semiconductor region provided on the first semiconductor region, the second semiconductor region being of a second conductivity type;
a third semiconductor region surrounding the second semiconductor region, the third semiconductor region being provided on the first semiconductor region, the third semiconductor region being of the first conductivity type, an impurity concentration of the first conductivity type in the third semiconductor region being higher than an impurity concentration of the first conductivity type in the first semiconductor region;
a plurality of ring-shaped regions surrounding the second semiconductor region, the plurality of ring-shaped regions being provided to be separated from each other between the second semiconductor region and the third semiconductor region, the plurality of ring-shaped regions being separated from the second semiconductor region and the third semiconductor region, the plurality of ring-shaped regions being of the second conductivity type;

a second electrode provided on the second semiconductor region and electrically connected to the second semiconductor region;

a third electrode surrounding the second electrode, the third electrode being provided on the third semiconductor region, the third electrode being electrically connected to the third semiconductor region;

a plurality of conductive layers surrounding the second electrode, the plurality of conductive layers being provided on the plurality of ring-shaped regions with an insulating layer interposed, the plurality of conductive layers being separated from each other between the second electrode and the third electrode, the plurality of conductive layers being separated from the second electrode and the third electrode; and a semi-insulating layer contacting the second electrode, the plurality of conductive layers, and the third electrode, each of the plurality of conductive layers being provided on two mutually-adjacent ring-shaped regions and a portion of the first semiconductor region positioned between the two ring-shaped regions.

8. The device according to claim 7, wherein a total impurity amount of the second conductivity type in the second semiconductor region is not less than $0.5\times10^{13}$ atoms/cm$^2$ and not more than $3.0\times10^{13}$ atoms/cm$^2$.

9. The device according to claim 7, wherein a resistivity of the semi-insulating layer is not less than $1.0\times10^8$ ($\Omega\cdot$cm) but less than $1.0\times10^{13}$ ($\Omega\cdot$cm).

10. The device according to claim 7, further comprising:
a fourth semiconductor region provided on the second semiconductor region, the fourth semiconductor region being of the first conductivity type; and
a gate electrode opposing the second semiconductor region with a gate insulating layer interposed.

11. The device according to claim 10, further comprising a fifth semiconductor region provided between the first electrode and the first semiconductor region, the fifth semiconductor region being of the second conductivity type.

* * * * *